(12) United States Patent
Sato (10) Patent No.: US 7,129,806 B2
(45) Date of Patent: Oct. 31, 2006

(54) THIN FILM BULK ACOUSTIC WAVE RESONATOR AND PRODUCTION METHOD OF THE SAME

(75) Inventor: Susumu Sato, Kanagawa (JP)

(73) Assignee: Sony Corporation, Tokyo (JP)

( * ) Notice: Subject to any disclaimer, the term of this patent is extended or adjusted under 35 U.S.C. 154(b) by 72 days.

(21) Appl. No.: 11/059,843

(22) Filed: Feb. 17, 2005

(65) Prior Publication Data
US 2005/0179508 A1   Aug. 18, 2005

(30) Foreign Application Priority Data
Feb. 18, 2004 (JP) .......................... P2004-041356

(51) Int. Cl.
*H03H 9/00* (2006.01)
*H01L 41/04* (2006.01)

(52) U.S. Cl. ................... 333/187; 333/191; 310/324

(58) Field of Classification Search ............... 333/187, 333/189, 191; 310/311, 324
See application file for complete search history.

(56) References Cited

U.S. PATENT DOCUMENTS

| | | | | |
|---|---|---|---|---|
| 4,642,508 | A * | 2/1987 | Suzuki et al. ............... | 310/321 |
| 5,910,756 | A * | 6/1999 | Ella .......................... | 333/133 |
| 6,204,737 | B1 * | 3/2001 | Ella .......................... | 333/187 |
| 6,617,751 | B1 * | 9/2003 | Sunwoo et al. ............ | 310/312 |
| 6,714,102 | B1 * | 3/2004 | Ruby et al. ................ | 333/189 |
| 6,828,713 | B1 * | 12/2004 | Bradley et al. ............ | 310/324 |
| 6,839,946 | B1 * | 1/2005 | Ylilammi et al. .......... | 29/25.35 |
| 6,992,420 | B1 * | 1/2006 | Jang et al. ................. | 310/324 |

FOREIGN PATENT DOCUMENTS

JP       2002 509644    3/2002

OTHER PUBLICATIONS

Satoh et al., "An Air-Gap Type Piezoelectric Composite Thin Film Resonator", IEEE Proc. 39th Annual Symp. Freq. Control, pp. 361-366 (1985).
Ylilammi et al., "Thin Film Bulk Acoustic Wave Filter", IEEE Transaction on Ultrasonics and Frequency Control, pp. 535-539 (2002).
Hara et al., "Aluminum Nitride Thin Film 2 GHz Resonator Using Germanium Sacrificial Layer Etching", MEMS Symposium, Tohoku Univ. (2002).

* cited by examiner

*Primary Examiner*—Dean Takaoka
(74) *Attorney, Agent, or Firm*—Bell, Boyd & Lloyd LLC (57) ABSTRACT

A thin film bulk acoustic wave resonator and method of producing same are provided. The thin film bulk acoustic wave resonator has a superior resonance characteristic (e.g., high-orientation and densification of a piezoelectric film), wherein the thin film bulk acoustic wave resonator that a local stress to a piezoelectric film is relaxed and improvement of productivity due to a stable structure without causing a crack of the piezoelectric film and high yield and a corresponding cost-reduction are realized, and the production method of the same, such as in an air bridge type thin film bulk acoustic wave resonator. In a region including a substrate, a support layer formed convexly on the substrate and a gap upper that the support layer, laminate of a bottom electrode, a piezoelectric film and a top electrode is formed, where the laminate is formed on the substrate and the support layer. The gap is formed between the support layer and the bottom electrode so that at least a portion of it is located upper than a surface of the support layer, and composes (makes up) a resonance region. For example, the support layer has a height of 20% or more of the maximum height from the support layer surface to the top of the gap.

20 Claims, 8 Drawing Sheets

10 : SUBSTRATE
11 : SUPPORT LAYER
12 : BOTTOM ELECTRODE
13 : PIEZOELECTRIC FILM
14 : TOP ELECTRODE
G : GAP

FIG. 1

10 : SUBSTRATE
11 : SUPPORT LAYER
12 : BOTTOM ELECTRODE
13 : PIEZOELECTRIC FILM
14 : TOP ELECTRODE
 G : GAP

PRIOR ART

THIN FILM BULK ACOUSTIC WAVE RESONATOR AND PRODUCTION METHOD OF THE SAME

CROSS REFERENCE TO RELATED APPLICATIONS

The present application claims priority to Japanese Patent Document No. P2004-041356 filed on Feb. 18, 2004, the disclosure of which is herein incorporated by reference.

BACKGROUND OF THE INVENTION

The present invention relates to a thin film bulk acoustic wave resonator and the production method of the same.

A film bulk acoustic wave resonator (FBAR) excelling in a filter characteristic and making it possible to a miniaturization of the RF front-end module receives an attention as an element used in a circuit such as a transmission filter and a duplexer in a wireless communication system such as a mobile phone and a wireless sensing system.

As a structure and a production method of the above-mentioned FBAR, methods such as (1) a substrate topside-depression method, (2) a substrate backside-via-hole method, (3) an air bridge method, (4) a multilayer acoustic mirror method are known.

In the above, an air bridge method among the above-mentioned methods is known as one of a method having high possibility of a cost-reduction.

For example, there is a description that an air bridge can be formed with using a sacrificial layer composed of zinc oxide (ZnO) in a production method of an air bridge structure FBAR in an article entitled "An Air-Gap Type Piezoelectric Composite Thin Film Resonator", IEEE Proc. 39th Annual Symp. Freq. Control, pp. 361–355 (1985), by Hiroshi Satoh, Yasuo Ebata, Hitoshi Suzuki and Choji Narahara.

Further, there is a description that an FBAR having effective characteristics can be produced by adopting copper (Cu) for a sacrificial layer in a production method of an air bridge structure FBAR in an article entitled "Thin Film Bulk Acoustic WaveResonator", IEEE Transaction on Ultrasonics, Ferroelectrics and Frequency Control (2002).

Further, it is described about a method improved for forming an FBAR and an FBAR formed on a substrate having more effective characteristics than a substrate used conventionally in Kohyo, Jpn. Unexamined Patent Publication No. 2002-509644.

On the contrary, it is described about a production method able to mount an FBAR on a semiconductor integrated circuit more effectively than related prior art by using a sacrificial layer composed of germanium (Ge) to form an air bridge in an article entitled "Aluminium Nitride Thin Film 2 Gz Resonator Using Germanium Sacrificial Layer Etching", MEMS Symposium 2002 Tohoku Univ, by Masayoshi Esashi and Motoaki Hara.

Figure 11:
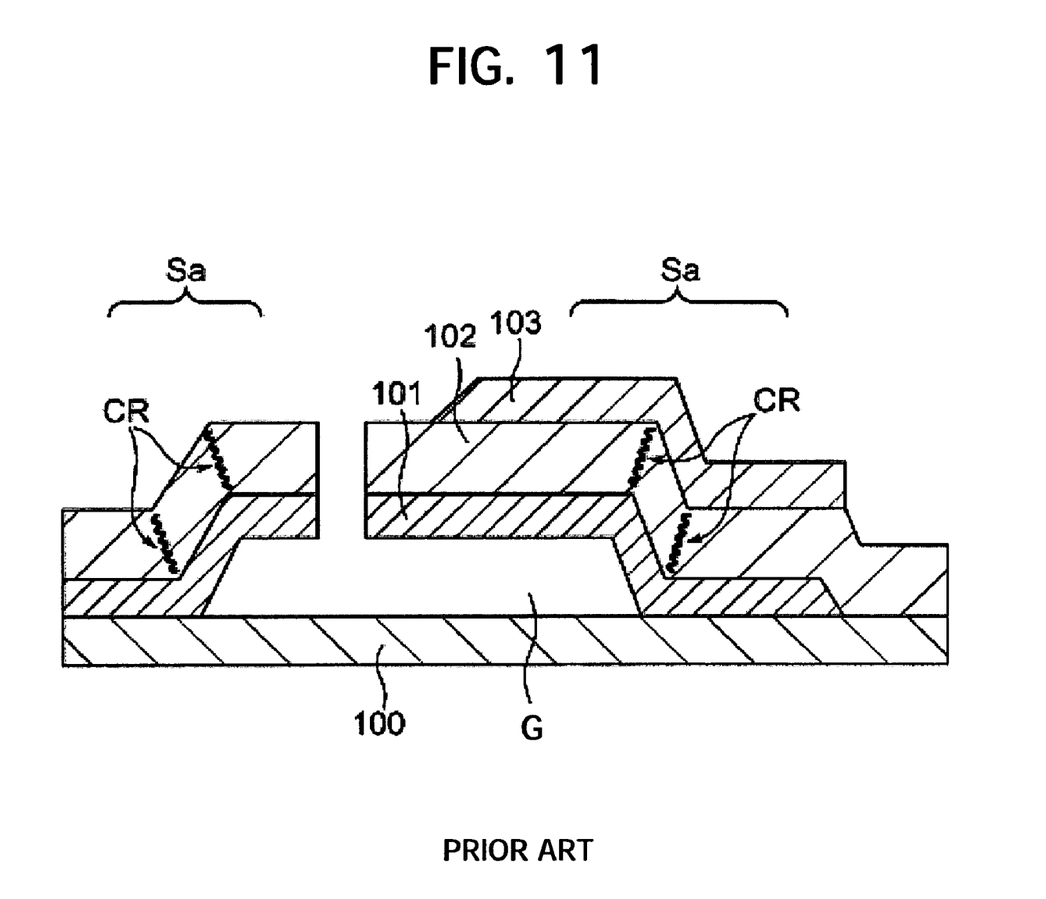
FIG. 11 is a cross sectional diagram showing a thin film bulk acoustic wave resonator according to the related prior art.

FIG. 11 is a cross sectional view showing composition of the above-mentioned air bridge structure FBAR according to a conventional example.

A bottom electrode 101, a piezoelectric film 102 and a top electrode 103 are laminated on a substrate 100.

Here, a predetermined gap G is placed between a bottom electrode 101 and a substrate 100 and it becomes a cavity as a resonance region enabling an oscillation of the piezoelectric film.

In the above-mentioned an air bridge structure FBAR, a convex surface ups and downs due to the gap G becoming a resonance region is characterized structurally. Consequently, a step shape due to a convex surface ups and downs is formed in a portion corresponding to a circumference edge Sa of the gap G for the piezoelectric film 102, and an accumulation and a concentration of an excessive film stress are arisen in the piezoelectric film 102.

Further, as a piezoelectric film formed in an FBAR, for example, it is desirable to adopt a ceramic piezoelectric material having a superior piezoelectric constant and an elastic constant to a bulk elastic device such as AlN, ZnO and PZT. However, these materials have remarkably high brittleness generally. Consequently, it includes a problem that a crack of a piezoelectric film by an accumulation and a concentration of a local stress to a piezoelectric film is raised easily.

A partial stress concentration to the ceramic piezoelectric films begins to raise a crack increasingly with adding an effect such as a physical impact, a heat treatment cycle and an interaction with an added piezoelectric film stress.

Environment loads of these slight processes induce defects of a piezoelectric film and those defects are clarified increasingly in subsequent processes.

On the contrary, a piezoelectric film having superior piezoelectric characteristics and elastic characteristics is desired for improving resonance characteristics of an FBAR. Now forming a film is performed with a sputtering technique usually to obtain those piezoelectric films, and it is necessary to obtain a dense film highly oriented to a C axis particularly in the case of AlN, ZnO and the like.

An internal stress of the film tends to become high as a film fills such characteristics. As a result, the high internal stress foments further a crack in a surface ups and downs portion in a region around a gap of an air bridge structure FBAR.

Further, mixed loading onto a semiconductor integrated circuit is the most advantageous composition because of compliance of a production process about an air bridge structure FBAR. However, a large restriction in mixed-loading on a semiconductor integrated circuit is a low-temperature film deposition system (e.g., a sputtering process in 400° C. or less) of a piezoelectric film.

This low-temperature sputtering process is similar to the above, an internal stress of a piezoelectric film tends to become high. As a result, the high internal stress foments further a crack in a surface ups and downs portion in a region around a gap of an air bridge structure FBAR.

Therefore, there is a large problem to realizing a provision of an FBAR having stable composition not causing a crack of a piezoelectric film, improvement of productivity and a cost-reduction due to heightening yield and more superior resonance characteristics (highly orientation and densification of a piezoelectric film) and relaxing a local stress concentration of this piezoelectric film for realizing a mixed loading process onto a semiconductor integrated circuit of such an FBAR.

SUMMARY OF THE INVENTION

The present invention relates to a thin film bulk acoustic wave resonator and the production method of the same.

An issue to be overcome is a point that an air bridge structure thin film bulk acoustic wave resonator has composition that a local stress concentrates easily at a piezoelectric film.

The thin film bulk acoustic wave resonator of the present invention in an embodiment has a laminate of a bottom electrode, a piezoelectric film and a top electrode, where the laminate is formed on a substrate and a support layer, in a region including a substrate, a support layer formed convexly on the substrate and a gap of an upper than the support layer, wherein at least a portion of the gap is formed to be located upper than a surface of the support layer between the support layer and the bottom electrode and to define a resonance region.

In the thin film bulk acoustic wave resonator of the present invention in an embodiment, a laminate of a bottom electrode, a piezoelectric film and a top electrode is formed on a substrate and a gap composing a resonance region is formed between the substrate in a gap region and the bottom electrode so that at least a portion of it is located upper than a surface of the substrate.

Here, in the gap region, support layer formed convexly on the upper surface of the substrate is formed.

The production method of the thin film bulk acoustic wave resonator of the present invention in an embodiment includes forming a sacrificial layer on a substrate, forming a mask layer having a non-parallel side surface with the sacrificial layer on a portion of the sacrificial layer, removing the sacrificial layer exposed around the mask layer by using the mask layer as a mask, removing the substrate exposed around the mask layer by using the mask layer as a mask to process a portion of the substrate to a support layer, forming a bottom electrode on at least the substrate and the sacrificial layer, forming a piezoelectric film on the bottom electrode, forming a top electrode on at least a portion of the piezoelectric film, forming a hole portion reaching the sacrificial layer through the bottom electrode and the piezoelectric film, and removing at least a portion of the sacrificial layer from the hole portion.

In the method of the film bulk acoustic wave resonator of the present invention in an embodiment, first, a sacrificial layer is formed on a substrate.

In an embodiment, a mask layer having a non-parallel side surface for the sacrificial layer surface is formed on a portion of the sacrificial layer.

In an embodiment, the sacrificial layer exposed around the mask layer is removed by using the mask layer as a mask.

In an embodiment, the substrate exposed around the mask layer is removed by using the mask layer and the sacrificial layer as a mask, and a portion of the substrate is processed to a support layer.

In an embodiment, a bottom electrode is formed on as least the substrate and the sacrificial layer.

In an embodiment, a piezoelectric film is formed on the bottom electrode.

In an embodiment, a top electrode is formed on at least a portion of the piezoelectric film.

In an embodiment, a hole portion reaching the sacrificial layer is formed through the bottom electrode and the piezoelectric film.

In an embodiment, at least a portion of the sacrificial layer is removed from the hole portion.

A thin film bulk acoustic wave resonator of the present invention in an embodiment can relax a local stress to a piezoelectric film and realize stable composition not causing a crack of a piezoelectric film, an improvement of productivity due to heightening yield and a corresponding cost-reduction.

A production method of thin film bulk acoustic wave resonator can produce the thin film bulk acoustic wave resonator of the present invention, in an embodiment by a mixed loading process onto a semiconductor integrated circuit.

Additional features and advantages of the present invention are described in, and will be apparent from, the following Detailed Description of the Invention and the figures.

DETAILED DESCRIPTION OF THE INVENTION

The present invention relates to a thin film bulk acoustic wave resonator and the production method of the same.

Preferred embodiments of the present invention will be described with reference to the accompanying drawings.

Figure 1:
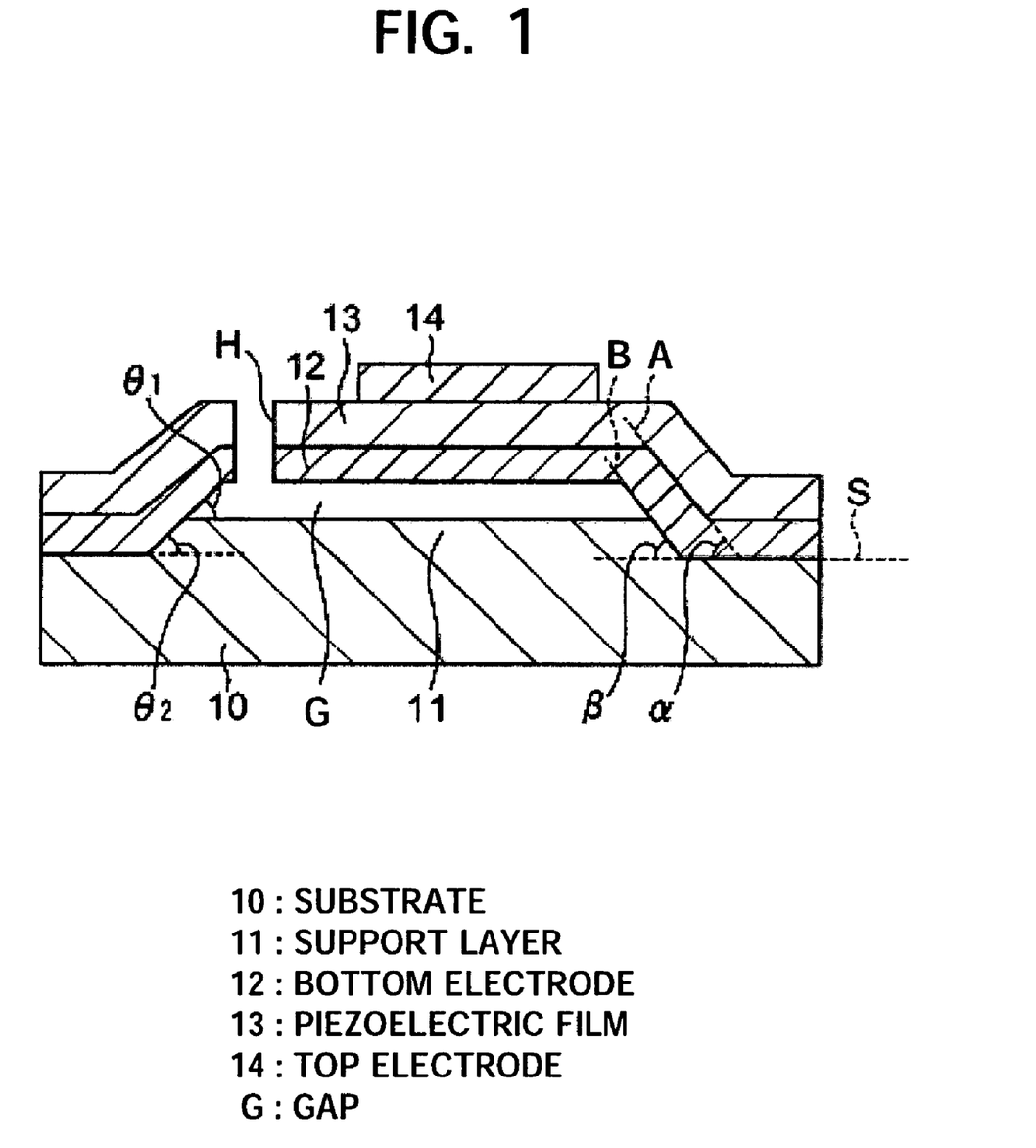
FIG. 1 is a cross sectional diagram showing a thin film bulk acoustic wave resonator according to a first embodiment.

FIG. 1 is a cross sectional diagram showing composition of an FBAR according to an embodiment.

For example, a silicon substrate 10 is formed convexly in a portion of a region corresponding to a gap region and composes a support layer 11. Further, a laminate of a bottom electrode 12, a piezoelectric film 13 and a top electrode 14 is formed in a region including a gap G region formed on the support layer 11. The bottom electrode 12 and the top electrode 14 are composed of, for example, molybdenum (Mo), tungsten (W), aluminum (Al), titanium (Ti) and the like. Further, the piezoelectric film 13 is composed of, for example, aluminum nitride, zinc oxide, PZT and the like.

In the gap region, a gap G composing a resonance region is composed on the support layer 11 formed with a portion of the silicon substrate 10 between the silicon substrate 10 and the bottom electrode 12. Here, a surface of the support layer 11 is formed, for example, in parallel with a surface of the circumjacent silicon substrate 10 and is located in upper than the surface of the circumjacent silicon substrate 10. Further, the top of the gap G is located in upper than the surface of the support layer 11. Further, an angle θ1 of the edge of the gap G and an angle θ2 set by a side wall of the support surface 11 and an extension of the silicon substrate 10 heading for a center of the substrate from the surface of the silicon substrate 10 are formed as the same angle.

In the bottom electrode 12 and the piezoelectric film 13, a hole H reaching the gap G is formed.

The thin film bulk acoustic wave resonator in an embodiment is an air bridge type, the support layer 11 composed of a portion of the substrate 10 is formed in the gap G formed between the laminate of the bottom electrode 12, the piezoelectric film 13 and the top electrode 14 and the substrate 10. Herewith, in comparison with a thin film bulk acoustic wave resonator of an air bridge type of related prior art, the piezoelectric film 13 can be supported by the support layer 11 with assuring the certain degree of height of the gap G, a local stress to the piezoelectric film 13 is relaxed. Therefore stable production not causing a crack, improvement of productivity due to heightening yield and cost-reduction can be realized.

Further, in an embodiment, preferably, the height from the surface of the substrate 10 to the surface of the support layer 11 corresponding to the height of the support layer 11 is equivalent to 20% or more of the height from the surface of the support layer 11 to the top of inner wall of the bottom electrode 12 corresponding to the height of the gap G. Note that, the reason why the height of the support layer 11 is made 20% or more of the height of the gap G will be mentioned later. Herewith, a film stress to the piezoelectric film is relaxed, and a crack can be reduced.

Further, the support layer 11 is formed with the silicon substrate 10 together. It is desirable that the substrate 10 and the support layer 11 are formed with the same material, however, in the case that the substrate 10 is composed of a laminate made of multiple layers, the support layer 11 and the substrate 10 may be formed with the different material.

Further, it is preferable that an interface A of the piezoelectric film 13 and the bottom electrode 12 in a step portion of an interface of the piezoelectric film 13 and the bottom electrode 12 corresponding to a shape of the edge of the support layer 11 is formed by including a plane, where an angle a formed with the plane and the surface S of the substrate 10 is 40 degrees or less. Herewith, since the step can be curbed by assuring the height of the gap G, a film stress to the piezoelectric film 13 is relaxed.

In a similar way, it is preferable that an inner wall portion B of the bottom electrode 12 in a step portion that is an inner wall surface composing the gap G is formed by including a plane, where an angle formed with the plane and the surface of the silicon substrate 10 is 40 degrees or less.

Further, it is preferable that the most external portion of the piezoelectric film 13 in the step portion is formed by including a plane, where an angle formed with the plane and the surface S of the silicon substrate 10 is 40 degrees or less.

In an angle formed with the substrate surface S in an embodiment, since the silicon substrate 10 and the surface of the support layer 11 are formed in parallel, the angle α and the angle β are equivalent to angles of the edge of the gap G and the edge of the support layer 11.

Further, in the case that the above-mentioned angle β and the angle formed with the most external portion of the piezoelectric film 13 and the surface of the substrate 10 are 40 degrees or less, since the film thicknesses of the bottom electrode 12 and the piezoelectric film 13 are formed equally in the whole area normally, it can be realized that the angle that is formed with the interface formed with the interface A of the piezoelectric film 13 and the bottom electrode 12 in the step portion and the surface S of silicon substrate 10 and equivalent to the edge of the gap G and the edge of the support layer 11 becomes 40 degrees or less.

Next, a production method of a thin film bulk acoustic wave resonator in an embodiment shown in FIG. 1 will be explained.

Figure 2A:
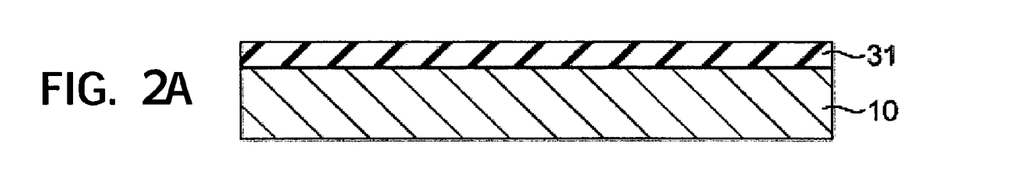
FIGS. 2A to 2C are cross sectional diagrams showing a production process of a production method of a thin film bulk acoustic wave resonator according to a first embodiment.
Figure 2B:
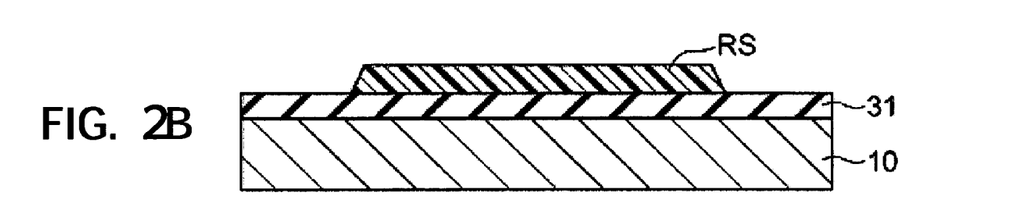
Figure 2C:
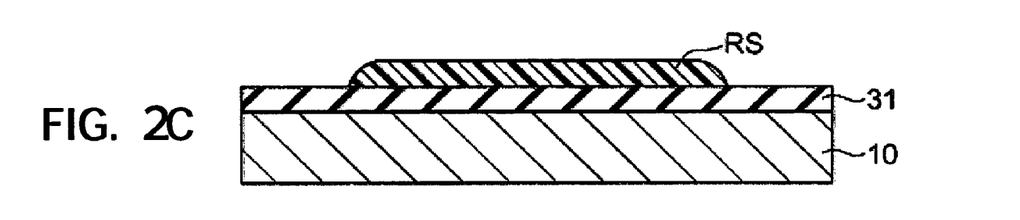
Figure 3A:
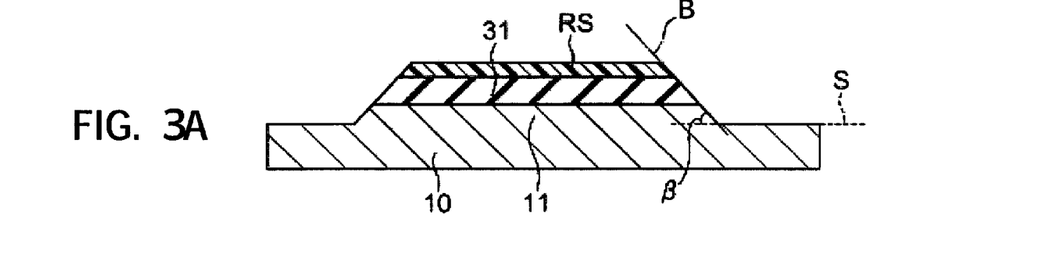
FIGS. 3A to 3C are cross sectional diagrams showing a production process of a production method of a thin film bulk acoustic wave resonator according to a first embodiment.
Figure 3B:
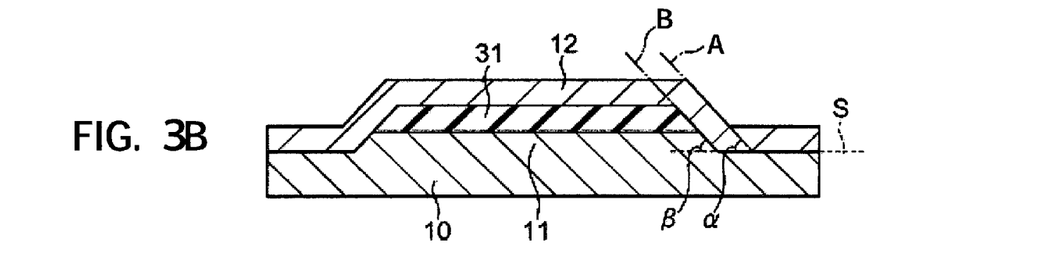
Figure 3C:
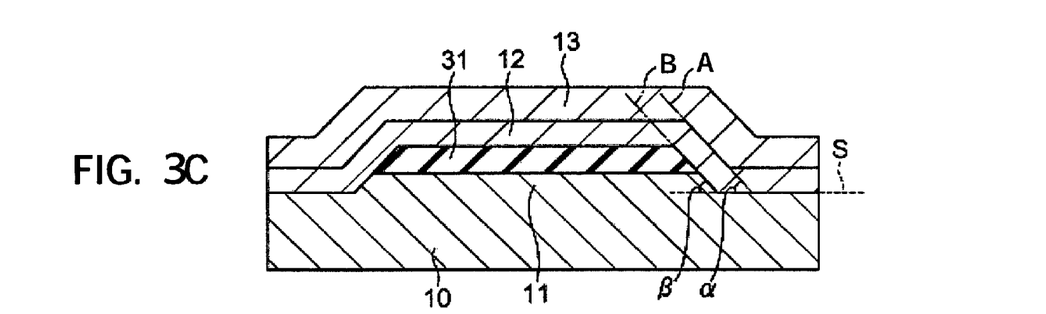
Figure 4A:
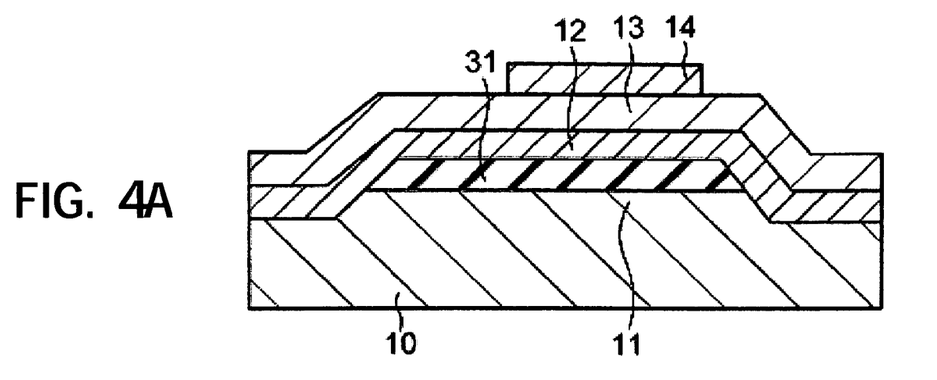
FIGS. 4A to 4C are cross sectional diagrams showing a production process of a production method of a thin film bulk acoustic wave resonator according to a first embodiment.
Figure 4B:
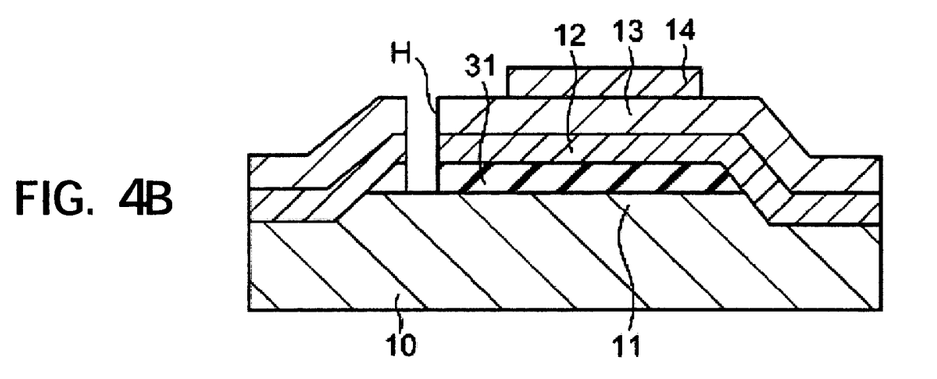
Figure 4C:
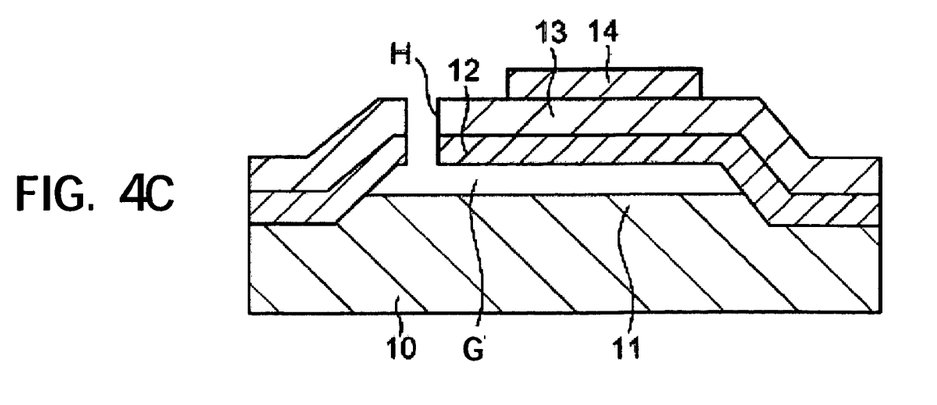

FIGS. 2 to 4 are cross sectional diagrams showing production processes in FIG. 1 sequentially.

First, as shown in FIG. 2A, a silicon oxide layer is deposited to the film thickness of about 1000 nm on the silicon substrate 10, for example, by the chemical vapor deposition (hereinafter called as CVD) method. This silicon oxide layer is a sacrificial layer 31.

Next, as shown in FIG. 2B, a resist film RS protecting the gap region in an upper region of the sacrificial layer 31 is pattern-formed. For example, a resist film material is applied to the sacrificial layer, and the resist film RS is pattern-formed with an existing photolithography process as shown in FIG. 2B.

Next, as shown in FIG. 2C, hard baking is performed to the resist film RS by 150° C. and 1 minute and 30 seconds by using, for example, a hot plate, and a side wall of the resist film RS is adjusted in a forward tapered shape of 40 degrees to 55 degrees.

Next, as shown in FIG. 3A, dry etching is performed in conditions of pressure of 5.3 Pa and radio-frequency wave 1200 W by using mixed gas of, for example, $CHF_3$, $CF_4$, Ar and $O_2$ and by using the resist film RS as a mask, and the exposed sacrificial layer 31 around the resist film RS and a portion of the silicon substrate 10 are removed sequentially, respectively.

Here, a side surface B having a forward tapered shape is formed in the sacrificial layer 31, an angle formed with the pattern-formed side surface B of the sacrificial layer 31 and the surface S of the silicon substrate 10, that is, the angle β of the edge of the gap G as mentioned later is formed. Further, by processing a portion of the silicon substrate 10 to the support layer 11 sequentially, a side surface B having a forward tapered shape is formed in the support layer 11 in a similar way.

In the above-mentioned etching, by changing a mixed gas ratio of etching, shapes of the side surfaces of the sacrificial layer 31 and the support layer 11 that are formed by different materials can be controlled respectively.

Further, by selecting a mixed gas ratio so that etching rates of the sacrificial layer 31 and the silicon substrate 10 are different, taper angles of the sacrificial layer 31 and the side surface of the support layer 11 can be controlled. For example, by controlling the etching rate of the sacrificial layer 31 to be 250 nm/minute to 600 nm/minute, the etching rate of the silicon substrate 10 to be 350 nm/minute to 900 nm/minute, the taper angle of each side surface is controlled to be 10 degrees to 45 degrees.

Further, the etching time is controlled so that the distance from the surface of the silicon substrate 10 after partly removed by etching to the surface of the silicon substrate 10 contacting with the sacrificial layer 31 and not being etched, that is, the film thickness of the support layer 11 becomes 20% or more of a thickness of the sacrificial layer 31.

As a result, the silicon substrate 10 under the resist film RS is processed to be the support layer 11.

Next, the resist film RS formed on the upper surface of the sacrificial layer 31 is removed by, for example, an ashing process.

Next, as shown in FIG. 3B, molybdenum (Mo) is deposited to film thickness of 150 nm on the surface of the sacrificial layer 31 and the silicon substrate 10, and the side surface of the sacrificial layer 31 and the support layer 11, by, for example, the sputtering method, and the bottom electrode 12 is formed.

Here, on the surface of the bottom electrode 12, a plane A is formed, where the plane composes the angle α that is an angle formed with the surface S of the silicon substrate 10 corresponding to the side surface B of the sacrificial layer 31 and the support layer 11, and pinched in the sacrificial layer 31 and the support layer 11.

Next, as shown in FIG. 3C, a piezoelectric material such as AlN is deposited on the bottom electrode to film thickness of 1.5 μm by, for example, a sputtering method and the piezoelectric film 13 is formed.

Here, on the surface of the piezoelectric film 13, a plane is formed, which corresponds to the interface B and the interface A and an angle is formed, which corresponds to the angle β and the angle α.

Next, as shown in FIG. 4A, molybdenum (Mo) is deposited by, for example, a sputtering method on the piezoelectric layer 13 to film thickness of 140 nm to 170 nm and processed to be a predetermined pattern, and the top electrode 14 is formed.

Next, as shown in FIG. 4B, a hole portion H is formed through the piezoelectric film 13 and the bottom electrode 12, and a portion of the sacrificial layer 31 is made to be exposed.

Next, as shown in FIG. 4C, the etching solution is made to be entered through the hole portion H by, for example, wet-etching using an HF solution and so on, and the sacrificial layer 31 is removed.

By the above-mentioned process, the thin film bulk acoustic wave resonator according to the present embodiment can be formed.

According to the present embodiment, the thin film bulk acoustic wave resonator can be formed easily, and it can be realized to produce by, for example, a mixed loading process to a semiconductor integrated circuit.

Figure 5:
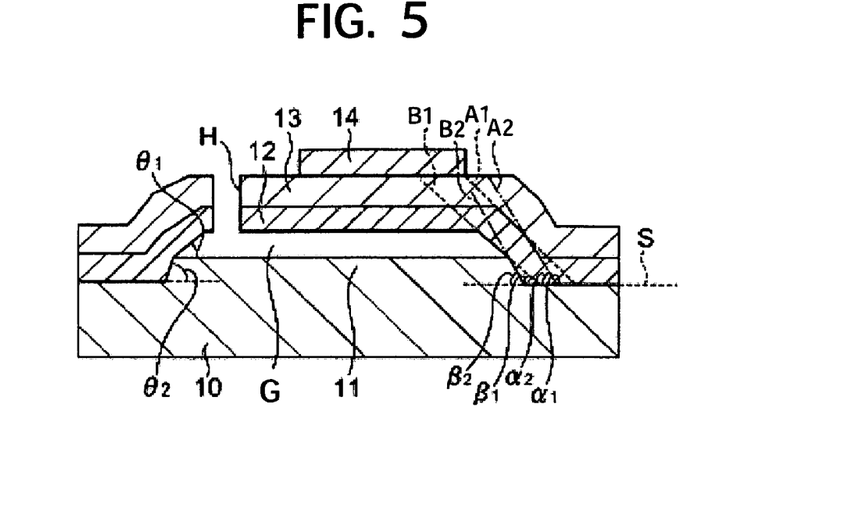
FIG. 5 is a cross sectional diagram showing a thin film bulk acoustic wave resonator according to a second embodiment.

FIG. 5 is a cross sectional diagram showing composition of thin film bulk acoustic wave resonator of another embodiment.

A thin film bulk acoustic wave resonator according to the present embodiment has, as composition shown in FIG. 5, different angles, where an angle θ2 that is corresponding to a shape of the edge of the support layer 11, and is formed with the side surface of the support layer 11 and an extension of a substrate surface, and an angle θ1 that is corresponding to a shape of the edge of a gap G, that is formed with a inner wall surface of a bottom electrode 12 and the surface of the support layer 11. That is, it is composition that an interface of the piezoelectric film 13 and the bottom electrode 12 is non-parallel with the surface S of the silicon substrate 10, and plural of planes where the angles formed with the surface S of the silicon substrate 1 0 are different are piled from the silicon substrate 10 side to that top of the gap G. Herewith, a stress to the piezoelectric film 13 can be relaxed further.

Figure 6:
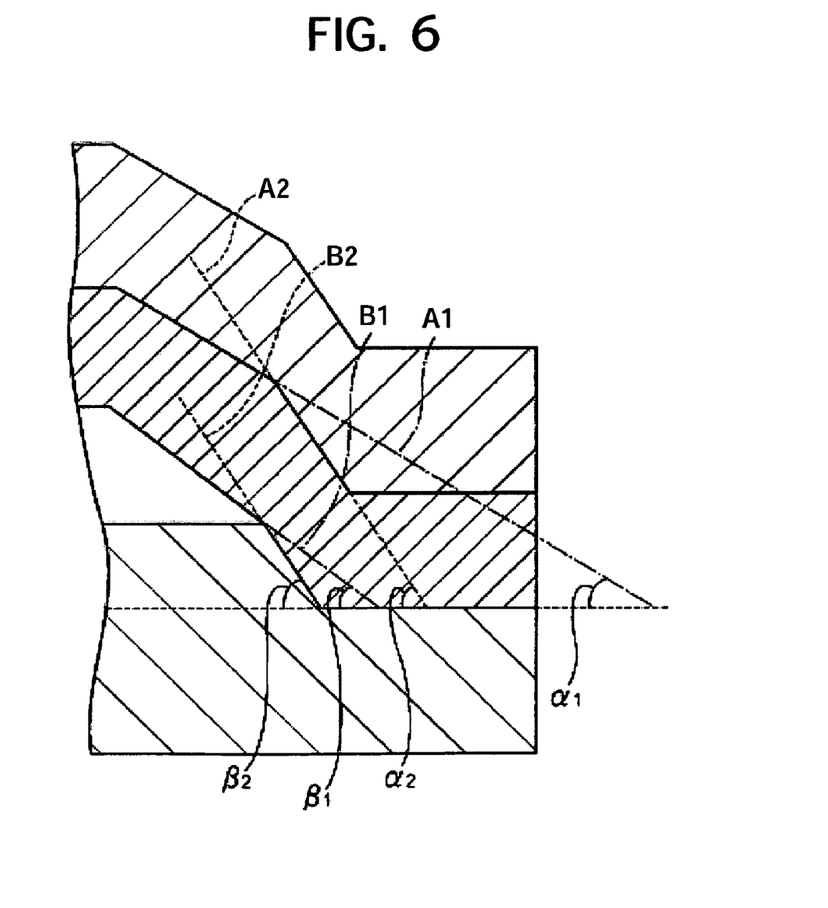
FIG. 6 is a partially enlarged view showing a portion of the thin film bulk acoustic wave resonator shown in FIG. 5.

FIG. 6 is a partial enlarged view showing a portion of a thin film bulk acoustic wave resonator shown in FIG. 5.

As shown in FIG. 6, an interface formed with the piezoelectric film 13 and the bottom electrode 12 in the step portion is composed of a first plane A1 composing a first angle α1 formed with the interface and the surface S of the silicon substrate 10, and a second plane A2 composing an angle α2. In a similar way, the inner wall surface of the bottom electrode 12 in the step portion is composed of a first plane B1 composing an angle β1 formed with the surface S of the silicon substrate 10 and a second plane B2 composing an angle β2. It is preferable that at least the either of above-mentioned first angles α1, β1 and the second angles α2, β2 is 40 degrees or less. In the above-mentioned composition, the first angle α1 is smaller than the second angle α2, however, the first angle α1 may be larger than the second angle α2.

A production method of a thin film bulk acoustic wave resonator according to an embodiment of the present invention will be explained. Since the thin film bulk acoustic wave resonator according to the present invention can be formed essentially in a process similar to the above-mentioned first embodiment, it will be explained focusing on a different portion.

Figure 7A:
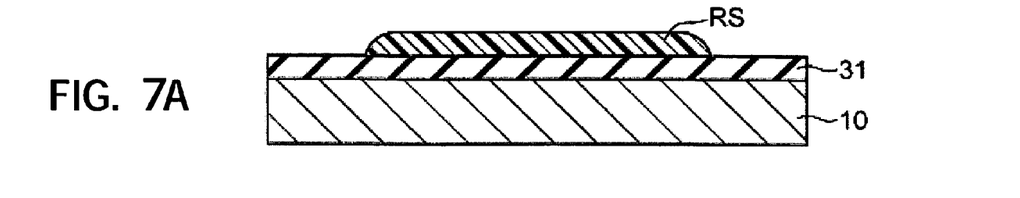
FIGS. 7A to 7B are cross sectional diagrams showing a production process of a production method of a thin film bulk acoustic wave resonator according to a second embodiment.

First, as shown in FIG. 7A, a silicon oxide layer is formed as a sacrificial layer 31 on a silicon substrate 10, for example, by the CVD method, and a resist film RS is pattern-formed on the top of the sacrificial layer 31. Then, the resist film RS is performed hard baking for example, by using a hot plate, and the side surface of the resist film RS is adjusted in a forward tapered shape.

Figure 7B:
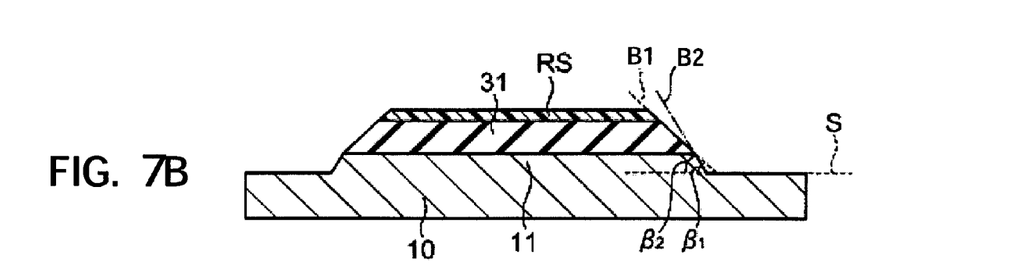

Next, as shown in FIG. 7B, dry etching is performed with using the resist film RS as a mask, the sacrificial layer 31 exposed around the resist film RS and a portion of the silicon substrate 10 are removed sequentially, respectively.

Here, the side surface B1 in a forward tapered shape is formed on the sacrificial layer 31, an angle formed with the pattern-formed side surface B1 of the sacrificial layer 31 and the surface S of the silicon substrate 10, that is, the first angle β1 is formed. The first angle β1 corresponds to an angle of the edge of the gap G as mentioned later. Further, by processing a portion of the silicon substrate 10 to the support layer 11 sequentially, in a similar way the side surface B2 in a forward tapered shape is formed on the support layer 11, and an angle formed with the side surface B2 of the support layer 11 and the surface S of the silicon substrate 10, that is, the second angle β2 is formed. The second angle β2 corresponds to an angle of the edge of the support layer 11 as mentioned later.

In the above mentioned etching, by changing a mixed gas ratio of the etching, shapes of the side surfaces of the sacrificial layer 31 and the support layer 11 are controlled respectively.

At this time, the mixed gas ratio is selected so that etching rates of the sacrificial layer 31 and the silicon substrate 10 are different, the taper angle of the side surface of the sacrificial layer 31 and the support layer 11 are controlled.

For example, the etching rate of the sacrificial layer 31 is controlled to be 250 nm/minute to 600 nm/minute, the etching rate of the silicon substrate 10 is controlled to be 350 nm/minute to 900 nm/minute, and the taper angle of each side surface is controlled to be 10 degrees to 45 degrees.

Further, etching time is controlled so that a thickness of the support layer 11 becomes 20% or more of the film thickness of the sacrificial layer 31. As a result, the silicon substrate 10 under the above-mentioned resist film RS is processed to the support layer 11.

Further, the resist film RS formed on the upper surface of the sacrificial layer 31 is removed by, for example, an ashing process.

Figure 8A:
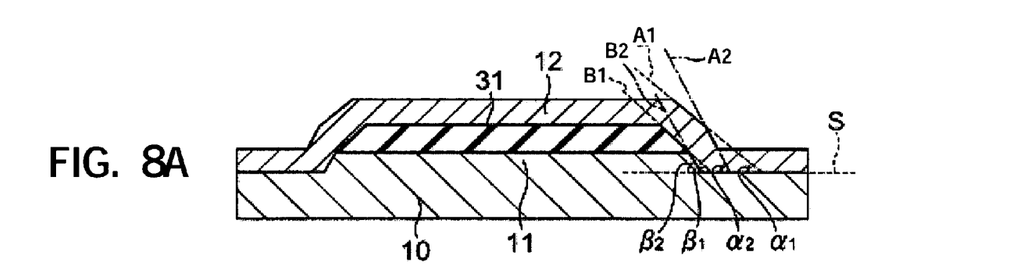
FIGS. 8A to 8B are cross sectional diagrams showing a production process of a production method of a thin film bulk acoustic wave resonator according to a second embodiment.

Next, as shown in FIG. 8A, molybdenum (Mo) is deposited on the surface of the sacrificial layer 31 and the silicon substrate 10, and on the side surface of the sacrificial layer 31 and the support layer 11, for example, by the sputtering method, and the bottom electrode 12 is formed.

Here, on the surface of the bottom electrode 12, a first plane A1 composing the first angle α1 and a second plane A2 composing the second angle α2 differing from the first angle α1 are formed corresponding to the first angle β1 of the side surface B1 of the sacrificial layer 31 and the second angle β2 of the side surface B2 of the support layer 11.

Figure 8B:
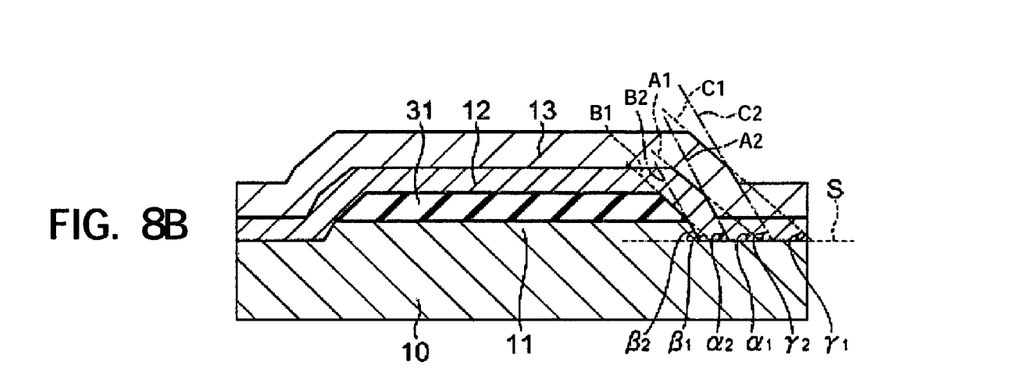

Next, as shown in FIG. 8B, for example, a piezoelectric material such as AlN is deposited on the bottom electrode by the sputtering method, and the piezoelectric film 13 is formed.

Here, on the piezoelectric film 13, a first plane C1 composing a first angle γ1 and a second plane C2 composing a second angle γ2 differing from the first angle γ1 are formed corresponding to the first plane A1 composing the first angle α1 and the second plane A2 composing the second angle α2 differing from the first angle α1.

Afterward, molybdenum (Mo) is deposited on the piezoelectric film 13 by the sputtering method and so on, processed to be a predetermined pattern to form the top electrode 14, a hole portion H is formed through the piezoelectric film 13 and the bottom electrode 12 to expose a portion of the sacrificial layer 31.

Next, the etching solution is made to be entered through the hole portion H by wet-etching such as, for example, an HF solution, and the sacrificial layer 31 is removed to form the thin film bulk acoustic wave resonator according to the present embodiment.

According to an embodiment of the present embodiment, the thin film bulk acoustic wave resonator can be formed easily and can be produced by, for example, a mixed loading process to a semiconductor integrated circuit.

Figure 9:
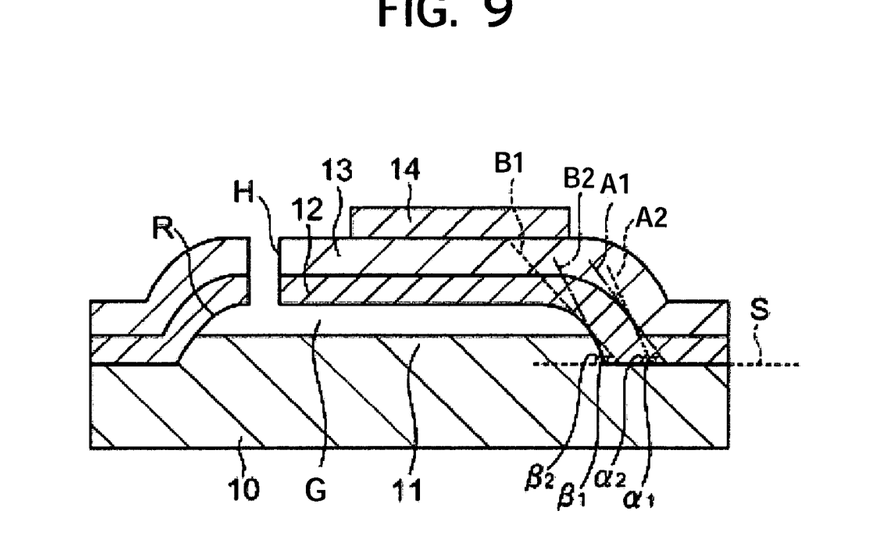
FIG. 9 is a cross sectional diagram showing a thin film bulk acoustic wave resonator according to a third embodiment.

FIG. 9 is a cross sectional diagram showing composition of a thin film bulk acoustic wave resonator according to another embodiment of the present invention.

A thin film bulk acoustic wave resonator according to the present embodiment, as composition shown in FIG. 9, an interface between the piezoelectric film 13 and the bottom electrode 12 is not parallel with the surface S of the silicon substrate 10, a plurality of planes, where the angles formed with the planes and the surface S of the silicon substrate 10 are different, is composed of curved surfaces having tangent lines changing sequentially from the side of the silicon substrate 10 to the topside of the gap G. Herewith, a stress to the piezoelectric film 13 can be relaxed further and it can become a preferable embodiment.

That is, the interface between the piezoelectric film 13 and the bottom electrode 12 in the step portion becomes a curved surface R having a tangential surface of which gradient changes sequentially so as to include the first plane A1 composing the first angle α1 and the second plan A2 composing the second angle α2. In the present embodiment, the above-mentioned curved surface R continues to reaching the top of the gap G. In a similar way, the inner wall surface of the bottom electrode 12 in the step portion is formed by a curved surface R including the first plane B1 composing the first angle β1 formed with the surface S of the silicon substrate 10 and the second plan B2 composing the second angle β2. In the above-mentioned curved surface R, it is preferably to include a tangent surface where the angle pinching the gap G or the support layer 11 is 40 degrees or less.

Note that, the thin film bulk acoustic wave resonator according to the present embodiment can be formed in a process similar to the above-mentioned embodiment except that shapes that the sacrificial layer and the support layer are processed are different essentially.

Figure 10:
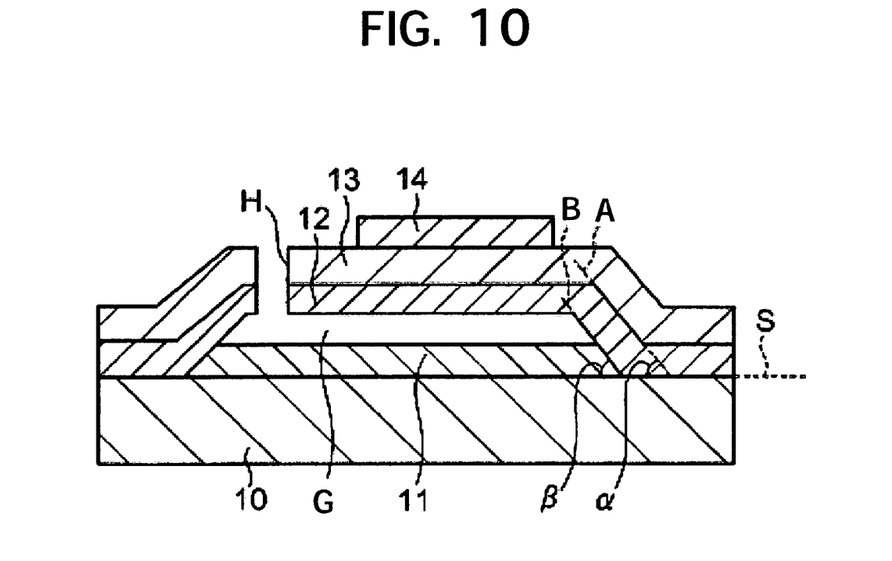
FIG. 10 is a cross sectional diagram showing a thin film bulk acoustic wave resonator according to a fourth embodiment.

FIG. 10 is a cross sectional diagram showing composition of a thin bulk acoustic wave resonator according to another embodiment of the present invention.

As mentioned above, the support layer 11 can be formed with processing a portion of the silicon substrate 10, however, as the present embodiment, a support layer 11 may be formed on the silicon substrate 10 separately. At this time, the substrate 10 and the support layer 1 1 formed separately are processed as an essential substrate.

In the thin film bulk acoustic wave resonator according to the present embodiment, as composition shown in FIG. 10, the support layer 11 is formed on a portion of the silicon substrate 10. About the other portion, a laminate of a bottom electrode 12, a piezoelectric film 13 and a top electrode 14 is formed in a region including a gap region on the support layer 11 in a way similar to the above. The support layer 11 is formed with a material different to the substrate 10.

The thin film bulk acoustic wave resonator according to the present embodiment can be formed with a process similar to the above-mentioned embodiment practically. Since materials of the support layer 11 and the substrate 10 are different, the support layer 11 can be processed to an intended shape easily by using a difference of an etching rate.

According to a thin bulk acoustic wave resonator and a production method of the same of the above-mentioned embodiment, following effects can be obtained:

(1) Stable formation with curbing a stress centering locally to the piezoelectric film due to a surface ups and downs around a gap of a resonance region that is a structural problem of an air bridge structure thin film bulk acoustic wave resonator and not causing a crack of the piezoelectric film, an improvement of productivity by heightening yield and a cost-reduction becomes possible without adding troublesome processes.

(2) A stress relaxation structure able to endure a concentration of a high internal stress adequately arisen by adopting a highly-oriented and densified film as a high-quality piezoelectric film necessary to product a thin film bulk acoustic wave resonator superior in resonance characteristics in an air bridge structure thin film bulk acoustic wave resonator can become possible and therefore a high-performance thin film bulk acoustic wave resonator can become possible.

(3) A stress relaxation structure able to endure a high internal stress of a piezoelectric film adequately caused by adopting a sputtering process at low-temperature by 400° C. or less desired in a mixed loading process on a semiconductor integrated circuit can become possible and therefore a mixed loading to the semiconductor integrated circuit can be realized.

(4) A production process, such as a physical impact added to a thin film bulk acoustic wave resonator production process after forming a piezoelectric film or an interaction with a heat treatment cycle and an electrode film stress becomes unconstrained, and therefore the optimum production process design can be adopted without a crack of the piezoelectric film.

(5) Because mechanical strength becomes able to assured adequately, it becomes able to endure a severe use environment secularly and therefore a highly reliable thin film bulk acoustic wave resonator can be produced.

EXAMPLE

In a thin film bulk acoustic wave resonator according to an embodiment having composition shown in FIG. 1, it was examined about generation of crack and destruction (peeling off) of the piezoelectric film 13 when the height of the support layer 11 formed from a portion of the silicon substrate 10 is changed variously to 0%, 5%, 10%, 15%, 20% and 25% of a height of the sacrificial layer 31 in the gap region between the silicon substrate 10 and the bottom electrode 12.

As a result, when the height of the support layer 11 is between 0% and 5% of the height of the sacrificial layer 31, generation of a crack and destruction of the piezoelectric film 13 was observed. Further, when 10%, generation of destruction of the piezoelectric film 13 was not observed, however, a crack of the piezoelectric film 13 was observed. When it became the height of 15%, generation of a crack was observed occasionally. Furthermore, when the height became 20% or more of the piezoelectric film 13 generation of a crack was hardly observed.

As mentioned above, a stress for the piezoelectric film 13 can be relaxed by setting the height of the support layer 11 to 20% or more of the height of the sacrificial layer 31. As a result, a piezoelectric film enduring a physical impact on a production process, an interaction with a heat treatment cycle and an electrode film stress and so on adequately can be obtained, and therefore a crack or destruction of the piezoelectric film can be curbed.

Next, generation of a crack of the piezoelectric film 13 was examined by fixing the height of the support layer 11 to 20%, when changing an angle a that was formed with an interface between the piezoelectric film 13 and the bottom electrode 12 and the silicon substrate 10 to 80 degrees, 60 degrees, 45 degrees and 40 degrees variously.

As a result, it has been understood that rather than enlarging the angle reducing the angle such as 45 degrees and 40 degrees does not generate a crack of the piezoelectric film 13. Particularly, a crack of the piezoelectric film 13 was hardly observed when the angle was 40 degrees or less. Therefore, a crack of the piezoelectric film 13 is not generated easily even if the angle is enlarged by forming the height of the support layer by 20% or more.

Because of the above-mentioned result, if a height of a support layer 11 is set by 20% or more of a sacrificial layer, a crack of a piezoelectric film is not generated easily even if an angle of an edge of the support layer 11 is large.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A thin film bulk acoustic wave resonator comprising:
   a substrate;
   a support layer formed convexly on said substrate, and
   a laminate of a bottom electrode, a piezoelectric film and a top electrode, which is formed on said substrate and said support layer, in a region comprising a gap upper than said support layer,
   wherein said gap is formed such that at least a portion of said gap is located between said support layer and said bottom electrode to define a resonance region.

2. A thin film bulk acoustic wave resonator as set forth in claim 1, wherein said support layer has a height of 20% or more of a maximum height from said support layer surface to a top region of said gap.

3. A thin film bulk acoustic wave resonator as set forth in claim 1, wherein said substrate and said support layer are formed with the same materials.

4. A thin film bulk acoustic wave resonator as set forth in claim 3, wherein said support layer is integrally formed with said substrate.

5. A thin film bulk acoustic wave resonator as set forth in claim 1, wherein an angle corresponding to a shape of an edge of said gap and formed with an interface between said piezoelectric film and said bottom electrode and said substrate surface, and an angle corresponding to a shape of an edge of said support layer and formed with an interface between said piezoelectric film and said bottom electrode and said substrate surface are the same.

6. A thin film bulk acoustic wave resonator as set forth in claim 1, wherein an angle corresponding to a shape of an edge of said gap and formed with an interface between said piezoelectric film and said bottom electrode and said substrate surface, and an angle corresponding to a shape of an edge of said support layer and formed with an interface between said piezoelectric film and said bottom electrode and said substrate surface are different.

7. A thin film bulk acoustic wave resonator as set forth in claim 1, wherein an angle corresponding to a shape of an edge of said gap and formed with an inner wall surface of said bottom electrode and a surface of said support layer, and an angle corresponding to a shape of an edge of said support layer and formed with an inner wall surface between said bottom electrode and a surface of said substrate are the same.

8. A thin film bulk acoustic wave resonator as set forth in claim 1, wherein an angle corresponding to a shape of an edge of said gap and formed with an inner wall surface of said bottom electrode and a surface of said support layer, and an angle corresponding to a shape of an edge of said support layer and formed with an inner wall surface of said bottom electrode and a surface of said substrate are different.

9. A thin film bulk acoustic wave resonator as set forth in claim 1, wherein in a step portion of an interface between said piezoelectric film and said bottom electrode, corresponding to a shape of an edge of said gap and a shape of an edge of said support layer, the interface between said piezoelectric film and said bottom electrode is non-parallel with a surface of said substrate and is formed by accumulating a plurality of surfaces having different angles formed with said interface and the surface of said substrate from said substrate side to a top side of said gap.

10. A thin film bulk acoustic wave resonator as set forth in claim 1, wherein in a step portion of an interface between said piezoelectric film and said bottom electrode corresponding to a shape of an edge of said gap and a shape of an edge of said support layer, said interface between said piezoelectric film and said bottom electrode is non-parallel with a surface of said substrate and is formed by a curved surface comprising a tangential surface that an angle formed with said interface and the surface of said substrate changes from said substrate side to the top side of said gap continuously.

11. A thin film bulk acoustic wave resonator as set forth in claim 1, wherein in a step portion of an interface between said piezoelectric film and said bottom electrode, corresponding to a shape of an edge of said gap and a shape of an edge of said support layer, the interface between said piezoelectric film and said bottom electrode is formed by comprising a surface that forms angles with said substrate surface, where at least either said angles pinching said gap and said support layer is 40 degrees or less.

12. A thin film bulk acoustic wave resonator as set forth in claim 1, wherein in a step portion of an inner wall surface of said bottom electrode, corresponding to a shape of an edge of said gap and a shape of an edge of said support layer, the inner wall surface of said bottom electrode is formed by comprising a surface that forms angles with the surface of said support layer or said substrate surface, where at least either said angles pinching said gap and said support layer is 40 degrees or less.

13. A method of producing a thin film bulk acoustic wave resonator, the method comprising:
    forming a sacrificial layer on a substrate;
    forming a mask layer comprising a non-parallel side surface with said sacrificial layer in a portion of said sacrificial layer;
    removing said sacrificial layer exposed around said mask layer by using said mask layer as a mask;
    removing said substrate exposed around said mask layer by using said mask layer as a mask to process a portion of said substrate to a support layer;
    forming a bottom electrode on at least said substrate and said sacrificial layer;
    forming a piezoelectric film on said bottom electrode;
    forming a top electrode on at least a portion of said piezoelectric film;
    forming a hole portion exposing said sacrificial layer through said bottom electrode and said piezoelectric film; and
    removing at least a portion of said sacrificial layer from said hole portion.

14. A method of producing a thin film bulk acoustic wave resonator as set forth in claim 13, wherein in processing a portion of said substrate to said support layer, a portion of said substrate is removed so that the thickness of said support layer is 20% or more for the maximum thickness of said sacrificial layer.

15. A method of producing a thin film bulk acoustic wave resonator as set forth in claim 13, wherein processing a portion of said substrate to said support layer, where at least a portion of said substrate processed to said support layer has an etching rate different from the other portion is processed.

16. A method of producing a thin film bulk acoustic wave resonator as set forth in claim 13, wherein forming said mask layer comprising:
    forming a mask layer material on the surface of said sacrificial layer;
    processing said mask layer material to a predetermined pattern, and;
    heating said mask layer to adjust an angle formed with a side wall of said mask layer and said sacrificial layer surface.

17. A method of producing a thin film bulk acoustic wave resonator as set forth in claim 13, wherein removing said sacrificial layer and processing a portion of said substrate comprising processing said sacrificial layer and said substrate continuously with changing an etching condition along the way by using said mask layer as a mask.

18. A method of producing a thin film bulk acoustic wave resonator as set forth in claim 13, wherein processing a portion of said substrate to said support layer comprises processing said substrate including accumulating a plurality of surfaces having different angles formed with a side wall of said support layer and said substrate surface from surface side to a top side of said sacrificial layer.

19. A method of producing a thin film bulk acoustic wave resonator as set forth in claim 13, wherein processing a portion of said substrate to said support layer comprises processing said substrate by forming a curve comprising a tangential surface changing an angle formed with a side wall of said support layer and said substrate surface continuously from said substrate side to a top side of said sacrificial layer.

20. A method of producing a thin film bulk acoustic wave resonator as set forth in claim 13, wherein forming said bottom electrode, said bottom electrode is formed to have a side wall that at least either angles pinching said sacrificial layer and said support layer is 40 degrees or less, where said angles is formed with said bottom electrode and said sacrificial layer surface.

* * * * *